(12) United States Patent
Molson

(10) Patent No.: US 7,360,189 B1
(45) Date of Patent: Apr. 15, 2008

(54) METHOD AND APPARATUS FOR ENABLING WAVEFORM DISPLAY IN A SYSTEM DESIGN MODEL

(75) Inventor: Philippe Molson, San Jose, CA (US)

(73) Assignee: Altera Corporation, San Jose, CA (US)

( * ) Notice: Subject to any disclaimer, the term of this patent is extended or adjusted under 35 U.S.C. 154(b) by 200 days.

(21) Appl. No.: 10/858,301

(22) Filed: Jun. 1, 2004

(51) Int. Cl.
*G06F 17/50* (2006.01)
(52) U.S. Cl. .................. 716/6; 716/1; 716/2; 716/4; 716/18
(58) Field of Classification Search .................. 716/1, 716/2, 4, 6, 18; 703/14
See application file for complete search history.

(56) References Cited

U.S. PATENT DOCUMENTS 6,651,225 B1 * 11/2003 Lin et al. .................. 716/4

* cited by examiner

*Primary Examiner*—Thuan Do
(74) *Attorney, Agent, or Firm*—L. Cho

(57) ABSTRACT

A method for generating a waveform display includes retrieving signal data associated with a node in a system design model from a system level electronic design automation tool. A value change dump file that describes the signal data is generated.

20 Claims, 7 Drawing Sheets

METHOD AND APPARATUS FOR ENABLING WAVEFORM DISPLAY IN A SYSTEM DESIGN MODEL

TECHNICAL FIELD

The present invention relates to the field of system level electronic design automation (EDA) tools. More specifically, the present invention relates to a method and apparatus for enabling waveform display of data signals from a system design model using a system level EDA tool.

BACKGROUND

System level EDA tools allow a designer to model, simulate, and analyze systems. Tools such as Simulink® from MathWorks® allow designers to create, simulate, evaluate, and refine a system design model through standard and custom block libraries. When designing a system with a system level EDA tool, it is desirable to have the capability to inspect various nodes of the model using visual waveform display. Among others, this facilitates the analysis of signal synchronization as well as signal dynamic range and could therefore drastically reduce the debug phase.

Existing system level EDA tools which do not read register transfer level (RTL) (VHDL or Verilog) model support very limited waveform viewing capabilities and do not always provide a user-friendly way method for designers to analyze signal synchronization. Designers interested in performing a more detailed waveform analysis were required to use techniques outside system level EDA tools. One of the techniques used for generating a more detailed waveform of data signals from a system design model included converting an entire system design model into a RTL representation. This involved converting the system design model into a hardware design language such as Very High Speed Integrated Circuit (VHSIC) Hardware Description Language (VHDL) or Verilog and simulating the entire system design model in an RTL simulator. This is for instance the flow used by tools such as DSP Builder. This approach required a significant amount of additional time and computing resources that resulted in slowing the design cycle which was undesirable. In addition, this approach failed to work on non RTL synthesizable system design models.

Thus, what is needed is an efficient method and apparatus for enabling waveform display on an EDA tool.

SUMMARY

According to an embodiment of the present invention, data signal values from one or more nodes in a system design model are used to generate one or more value change dump (VCD) files. The one or more VCD files may be loaded into a waveform viewer to output one or more waveform displays of the data signal values from the one or more nodes.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

In the following description, for purposes of explanation, specific nomenclature is set forth to provide a thorough understanding of embodiments of the present invention. However, it will be apparent to one skilled in the art that these specific details may not be required to practice the embodiments of the present invention. In other instances, well-known circuits, devices, programs, and procedures are shown in block diagram form to avoid obscuring embodiments of the present invention unnecessarily.

Figure 1:
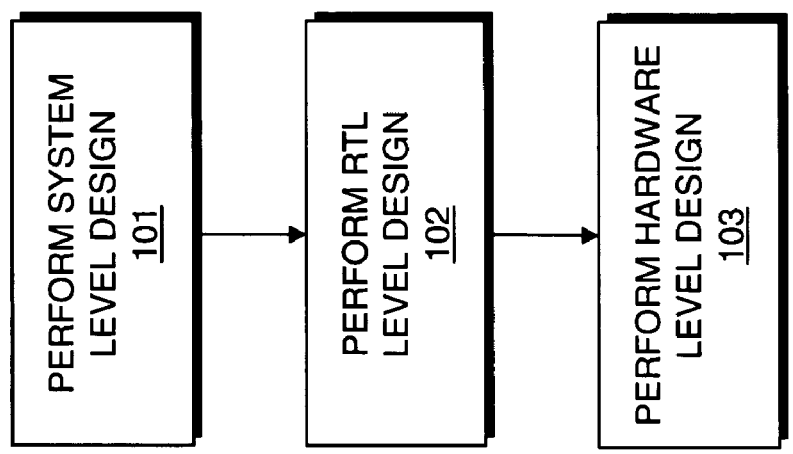
FIG. 1 is a flow chart illustrating a method for designing a system according to an embodiment of the present invention.

FIG. 1 is a flow chart that illustrates a method for designing a system according to an embodiment of the present invention. The method may be performed with the assistance of one or more types of EDA tools. At 101, system level design is performed. System level design involves creating a system design model that reflects an abstract level of design of the system. The system level design may include generic blocks that represent general functionalities. The system level design may be performed using a system level EDA tool that allows a designer to create the system design model. The system level EDA tool may provide a library of predefined and user-definable blocks, routing tools for connecting blocks together, and simulation tools for running the system design model. A system level EDA tool that may be used to perform the system level design at 101 is Simulink®. According to an embodiment of the present invention, a VCDSink block is provided that can be selected by a designer to export signals from the system level EDA tool to a waveform viewer. When a simulation of the system design model is run, the VCDSink block generates a value change dump file which can be read by a waveform viewer. Exemplary waveform viewers include Undertow from Veritools or SignalSCan from Cadence®. The display of the waveform may be used by a designer to analyze and evaluate a current system design model and make modifications to the system design model.

At 102, RTL level design is performed. RTL level design involves converting the system design model into a hardware design language such as VHDL or Verilog. RTL level design may include further specifying design details of the generic blocks described in the system level design. RTL level design may also include simulating the system design model in an RTL simulator. The RTL level design may be performed using a RTL level EDA tool. RTL level EDA tools that may be used to perform the RTL simulation level design at 102 include ModelSim® from Mentor Graphics® and NC Verilog from Cadence®. or VCS from Synopsys®.

At 103, hardware level design is performed. Hardware level design involves determining how to implement the system design model generated at 101 and 102 onto a physical target device. According to an embodiment of the present invention, the physical target device may be a field programmable gate array (FPGA). In this embodiment, hardware level design involves synthesis, mapping, placement, and routing. Synthesis may include generating a logic design having an optimized logical representation of the system to be implemented by a target device. Mapping may include determining how to implement components such as logic gates and other logic components in the optimized logic representation with resources available on the target device. Placement may include fitting the system on the target device by determining which resources on the target device is to be used for specific components and connections between the components. Routing may include allocating routing resources on the target device to provide interconnections between logic gates, logic elements, and other components on the target device. The hardware level design may be performed using a hardware level design EDA tool. A hardware level design EDA tool that may be used to perform hardware level design include Quartus® by Altera® Corporation.

Figure 2:
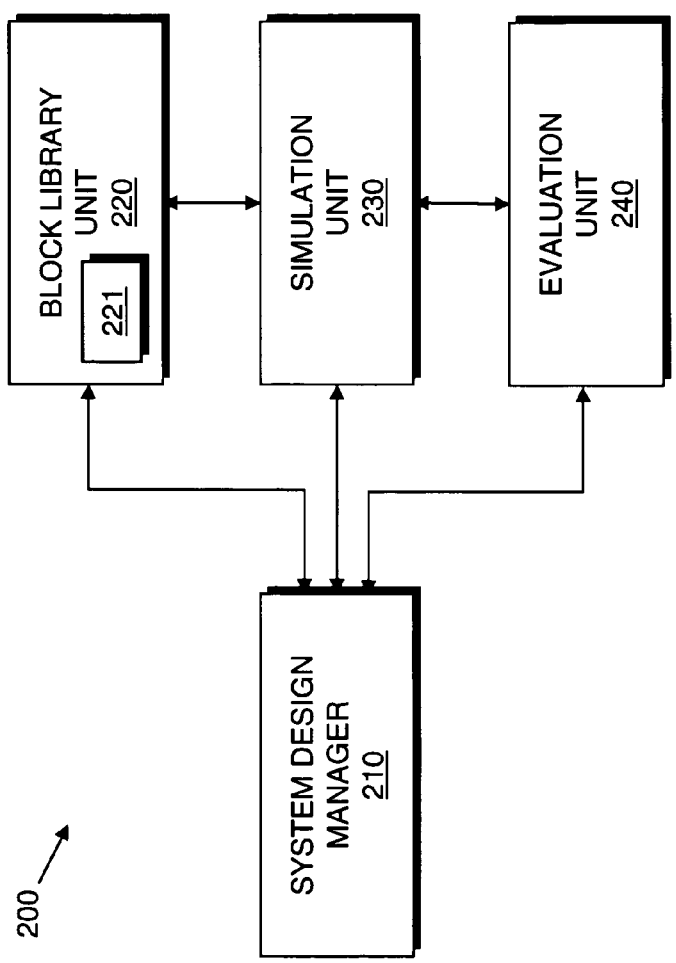
FIG. 2 illustrates a system level EDA tool according to an embodiment of the present invention.

FIG. 2 illustrates a system level EDA tool 200 according to an embodiment of the present invention. The system level EDA tool 200 may be implemented to perform the system level design described with reference to 101 (shown in FIG. 1). The system level EDA tool 200 includes a system design manager 210. The system design manager 210 interfaces with other modules in the system level EDA tool 200 and includes a graphical user interface that allows a designer to select and operate features provided by the other modules in the system level EDA tool 200.

The system level EDA tool 200 includes a block library unit 220. The block library unit 220 includes a plurality of blocks that implement commonly required modeling functions. These may include, for example, application-specific block sets for digital signal processing, fixed-point, communications, and other types of systems. The system level EDA tool 200 allows custom code to be incorporated as blocks in the block library unit 220 through system functions provided by the system level EDA tool 200. The blocks in the block library unit 220 may be used to generate a system design model.

The system level EDA tool 200 includes a simulation unit 230. The simulation unit 230 allows a designer to run simulations on a system design model created and view results generated by the simulated system design model. The simulation unit 230 may include integration algorithms suited for continuous-time (analog), discrete-time (digital), hybrid, mixed-signal, and multi-rate simulations. The simulation unit 230 may also include debugging tools that allow a designer to locate and diagnose errors in the system design model.

The system level EDA tool 200 includes an evaluation unit 240. The evaluation unit 240 allows a designer to analyze and test a system design model. The evaluation unit 240 may include tools that perform linearization, equilibrium point determination, parameter optimization, and parametric analysis. The evaluation unit 240 may also include tools to help a designer to generate test conditions and validate the system design model's performance.

According to an embodiment of the system level EDA tool 200, the block library unit 220 includes a waveform unit 221 that provides a VCDSink block. The VCDSink block can be selected by a designer to export signals from the system level model of the system level EDA tool 200 to a waveform viewer. When a simulation of the system design model is run by the simulation unit 230, the VCDSink block generates a value change dump file which can be read by the waveform viewer. The VCDSink block acts as a sink block. The VCDSink block may be connected to nodes at any hierarchy level on the system level model to perform waveform analysis. The system level model may include a plurality of VCDSink blocks. This allows for parallel waveform analysis display and the visualization of events at a plurality of nodes.

Figure 3:
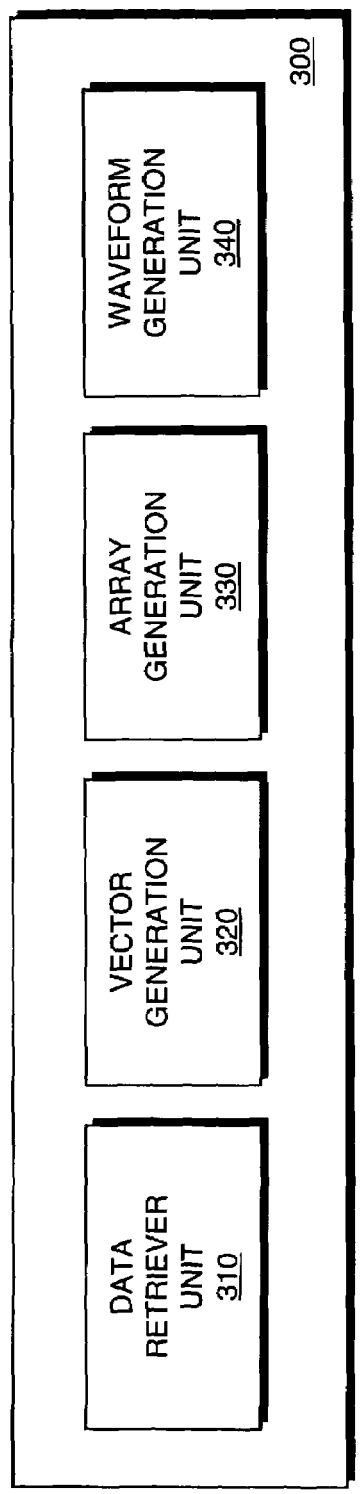
FIG. 3 illustrates a waveform unit according to an embodiment of the present invention.

FIG. 3 illustrates a waveform unit 300 according to an embodiment of the present invention. The waveform unit 300 may be used to implement the waveform unit 221 shown in FIG. 2. According to an embodiment of the present invention where the system level EDA tool is Simulink®, the waveform unit 300 may be implemented for Simulink® using a SystemC™ C++ VCD function within S-Mex C++ wrapper. The waveform unit 300 includes a data retriever unit 310. The data retriever unit 310 retrieves signal data associated with a node in a system design model. The signal data is written into a text file. According to an embodiment of the data retriever unit 310, a designer is allowed to select a format with which the signal data is to be written into the text file. The format may be, for example, a signed integer, unsigned integer, or Boolean format. A designer may be allowed to select a time period in which signal data is to be collected (a starting and ending point). The designer may also be allowed to retrieve signal data associated with as many nodes in the system design model as he would like.

The waveform unit 300 includes a vector generation unit 320. The vector generation unit 320 generates one or more time vectors from the text file written by the data retriever unit 310. According to an embodiment of the vector generation unit 320, the time vector may be in a Standard Template Library (STL) format. Each time vector represents one or more signals from one or more nodes during a point of time the system design model is simulated.

The waveform unit 300 includes an array generation unit 330. The array generation unit 330 formats the signal data in the time vectors generated by the vector generation unit 320 into arrays in memory that is readable by a waveform generator.

The waveform unit 300 includes a waveform generation unit 340. The waveform generation unit 340 reads the signal data in the arrays in memory generated by the array generation unit 330 and generates waveform representation of the signal data. The waveform generation unit 340 writes the waveform representation of the signal data into a VCD file. The VCD file may be used as an input to a RTL level EDA tool for viewing or for comparing results of multiple simulation runs, using the same of different simulator environments. According to an embodiment of the waveform unit 300, the waveform generation unit 340 generates a RTL simulator specific script to simplify the process of importing VCD file into a waveform viewer. For example, the waveform generation unit 340 may generate a Tcl script that converts the VCD file into a waveform format .wlf that is readable by ModelSim®, and that starts the waveform viewer on ModelSim® to display the waveform.

Figure 4:
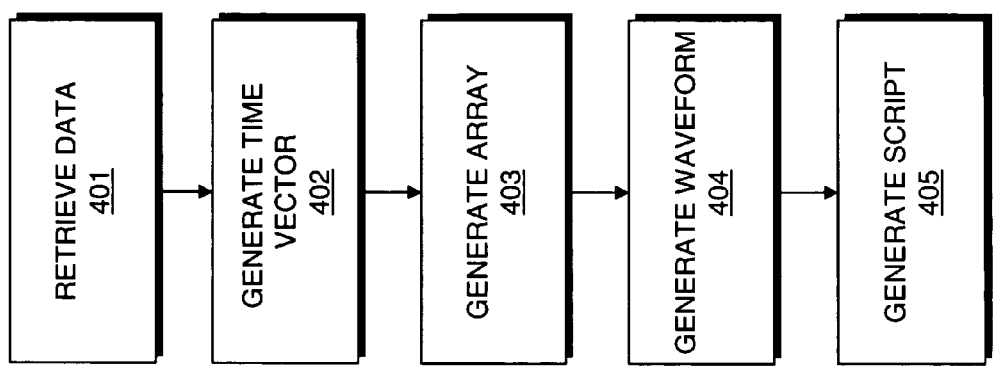
FIG. 4 is a flow chart illustrating a method for enabling waveform display according to an embodiment of the present invention.

FIG. 4 is a flow chart illustrating a method for enabling waveform display according to an embodiment of the present invention. At 401, signal data is retrieved from a node on a system level model that is to be analyzed. According to an embodiment of the present invention, a designer can couple an input of a VCDSink block to the node that is to be analyzed. The signal data that is retrieved is written into a text file. According to an embodiment of the present invention, the signal data is written into the text file in a format specified by the designer.

At 402, a time vector is generated. The time vector is generated from the signal data in the text file from 401. According to an embodiment of the present invention, one or more time vectors are generated where each time vector includes signal data associated with one or more nodes during a point of time where the system design model is simulated.

At 403, an array is generated. According to an embodiment of the present invention, one or more arrays are generated in memory from the one or more time vectors. The arrays are readable by a waveform generator.

At 404, a waveform is generated for the signal data. According to an embodiment of the present invention, a waveform is generated from the one or more arrays in memory. The waveforms are written into a VCD file.

At 405, a script is generated. The script prompts the display of the VCD file on a waveform viewer. According to an embodiment of the present invention, the script may be a Tcl script that converts the VCD file into a waveform format that is readable by a waveform viewer.

FIGS. 1 and 4 are flow charts illustrating embodiments of the present invention. Some of the techniques illustrated in the figures may be performed sequentially, in parallel or in an order other than that which is described. It should be appreciated that not all of the techniques described are required to be performed, that additional techniques may be added, and that some of the illustrated techniques may be substituted with other techniques.

Figure 5A:
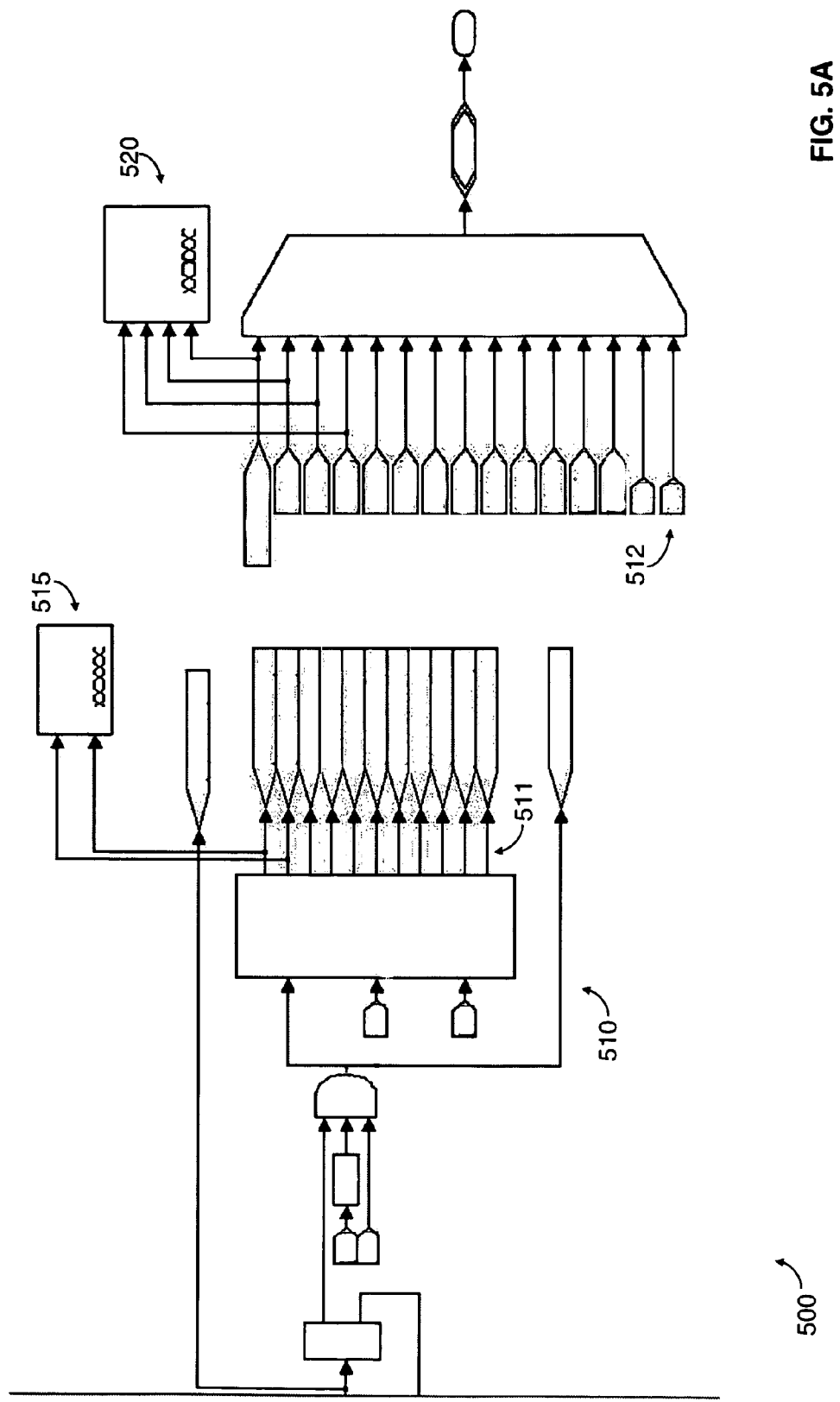
FIGS. 5a-c illustrate waveform displays of data signals from a system design model.
Figure 5B:
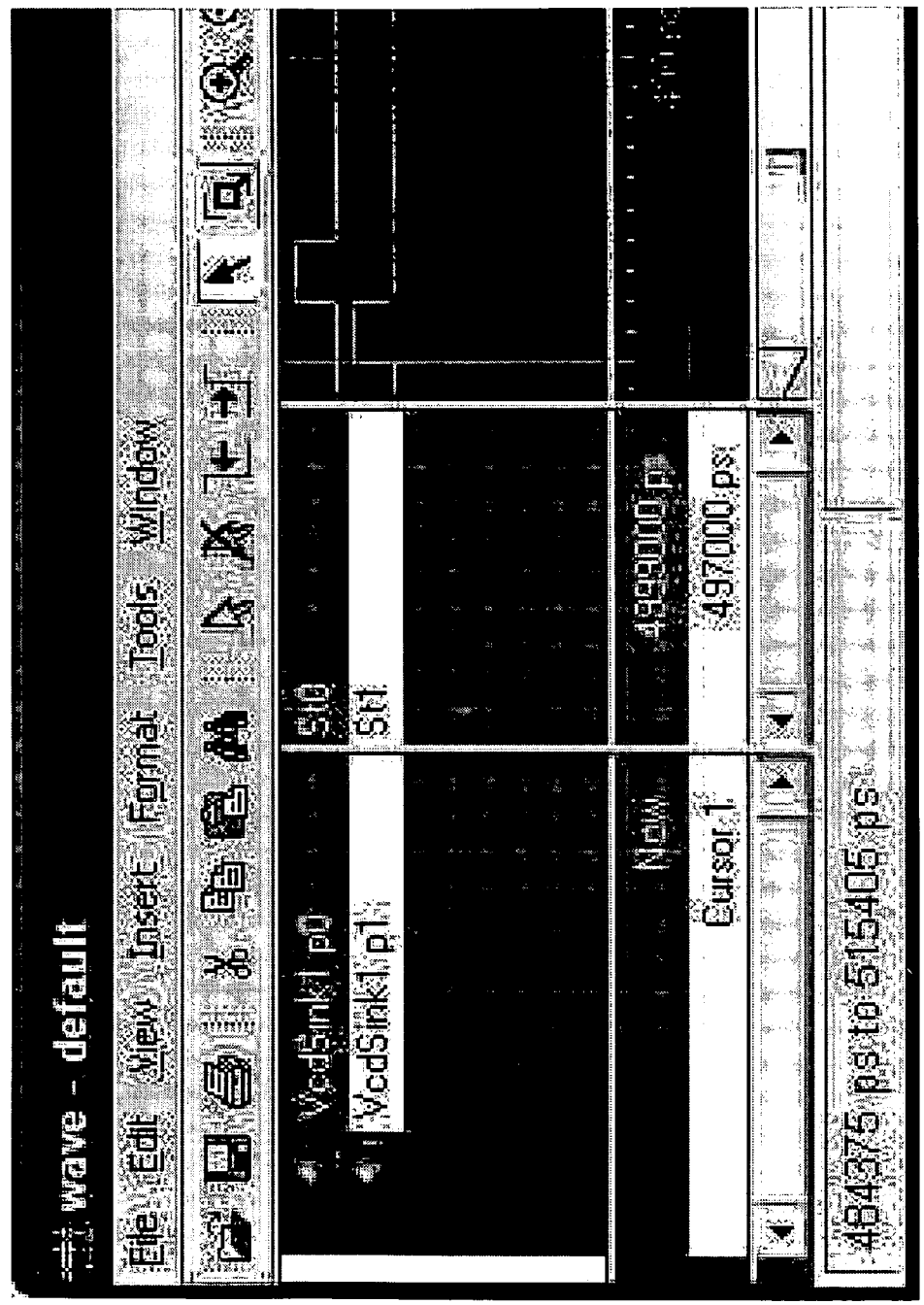
Figure 5C:
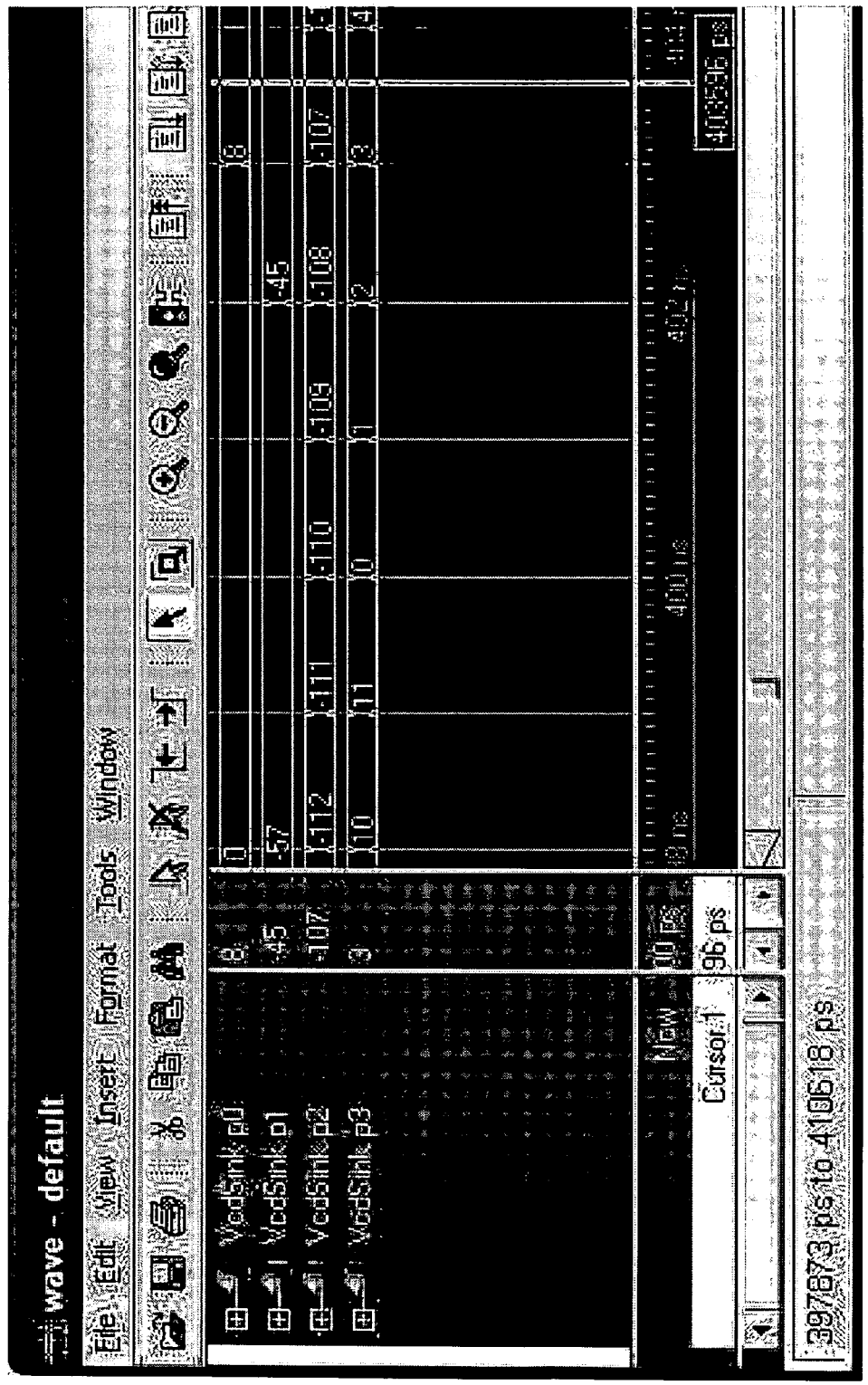

FIGS. 5a-c illustrate waveform displays of data signals from a system design model. FIG. 5a illustrates a first screen 500 that displays a system design model 510 being generated by a system level EDA tool. The system design model 510 includes a first VCDSink block 515 and a second VCDSink block 520. The inputs to the first VCDSink block 515 include signals 0-1 from a first component 511 in the system design model 510. The inputs to the second VCDSink block 520 include signals 0-3 from a second component 512 in the system design model 510. The VCDSink blocks 515 and 520 capture the data signals from the system design model 510 and writes out a VCD file that is loaded into a waveform viewer.

FIG. 5b illustrates a second screen 550 that displays the waveform generated from the data signals from the first component 511 in the system design model 510. FIG. 5c illustrates a third screen 560 that displays the waveform generated from the data signals from the second component 512 in the system design model 510.

It should be appreciated that embodiments of the present invention enable waveform display of data signals generated from a system level EDA tool. Displaying the waveform of data signals on a waveform viewer allows a designer to analyze relative cycle positions of signals and to view the waveform of data signals in radix such as hex or binary. The embodiments of the present invention enable waveform display without requiring a system design model to be translated into RTL. Thus, compilation of an entire system design model in HDL is not required. Only signals specified by the designer is analyzed and displayed on a waveform viewer. Furthermore, since the system design model is not required to be translated into RTL, the system design model need not be completely synthesizable.

Embodiments of the present invention may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular hardware or software configuration. They may find applicability in any computing or processing environment. The techniques may be implemented in hardware, software, or a combination of the two.

The term "machine readable medium" used herein shall include any medium that is capable of storing or encoding a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for generating a waveform display, comprising:
    retrieving signal data at a node in a system design model, that reflects an abstract level of design prior to being implemented in hardware description language, from a system level electronic design automation tool;
    generating a value change dump (VCD) file that describes the signal data; and
    generating a time vector from the signal data.

2. The method of claim 1, further comprising displaying the VCD file on a waveform viewer.

3. The method of claim 2, wherein generating the VCD file comprises making a call to a function capable of generating a waveform.

4. The method of claim 2, wherein displaying the VCD file is automated using a script.

5. The method of claim 1, wherein retrieving the signal data comprises writing the signal data into a text file.

6. The method of claim 1, wherein retrieving the signal data comprises writing the signal data into a file according to a user-specified format.

7. The method of claim 1, further comprising converting the time vector to an array readable by a function capable of transforming the array to a waveform.

8. The method of claim 1, wherein the system design model includes generic blocks that represent general functionalities.

9. A machine readable medium having stored thereon sequences of instructions, the sequences of instructions including instructions which, when executed by a processor, causes the processor to perform:
    retrieving signal data at a node in a system design model, having a plurality of blocks that represent general functionalities and that reflects an abstract level of design prior to being implemented in hardware description language, from a system level electronic design automation tool;
    generating a value change dump (VCD) file that describes the signal data; and
    generating a time vector from the signal data.

10. The machine-readable medium of claim 9, further comprising instructions which when executed by the processor causes the processor to perform displaying the VCD file on a waveform viewer.

11. The machine-readable medium of claim 9, wherein retrieving the signal data comprises writing the signal data into a text file.

12. The machine-readable medium of claim 9, wherein retrieving the signal data comprises writing the signal data into a file according to a user-specified format.

13. The machine-readable medium of claim 9, further comprising instructions which when executed by the processor causes the processor to perform generating a time vector from the signal data.

14. The machine-readable medium of claim 9, wherein generating the VCD file comprises making a call to a function capable of generating a waveform.

15. The machine-readable medium of claim 9, wherein displaying the VCD file is automated using a script.

16. A waveform unit, comprising:
- a data retriever unit to retrieve signal data at a node in a system design model, that reflects an abstract level of design prior to being implemented in hardware description language, from a system level electronic design automation tool;
- a waveform generation unit to generate a value change dump (VCD) file that describes the signal data; and
- a vector generation unit to generate a time vector from the signal data.

17. The waveform unit of claim 16, wherein the data retriever unit writes the signal data into a text file.

18. The waveform unit of claim 16, further comprising an array generation unit to convert the time vector to an array readable by a function capable of transforming the array to a waveform.

19. The waveform unit of claim 16, wherein the waveform generation unit generates a script to display the VCD file on a waveform viewer.

20. The waveform unit of claim 16, wherein the system design model includes generic blocks that represent general functionalities.

* * * * *